United States Patent [19]
Manca, Jr.

[11] Patent Number: 5,185,745
[45] Date of Patent: Feb. 9, 1993

[54] SCAN PATH DIAGNOSTIC METHOD

[75] Inventor: Peter J. Manca, Jr., Southboro, Mass.

[73] Assignee: Prime Computer, Inc., Bedford, Mass.

[21] Appl. No.: 523,004

[22] Filed: May 14, 1990

[51] Int. Cl.$^5$ .............................. H04B 17/00
[52] U.S. Cl. .................. 371/22.3; 371/22.1; 371/15.1
[58] Field of Search ............ 371/22.3, 22.1, 15.1, 371/22.6

[56] References Cited

U.S. PATENT DOCUMENTS

| | | | |
|---|---|---|---|
| 4,268,902 | 5/1981 | Berglund et al. | 264/200 |
| 4,503,537 | 3/1985 | McAnney | 371/25 |
| 4,513,418 | 4/1985 | Bardell, Jr. et al. | 371/25.1 |
| 4,534,028 | 8/1985 | Trischler | 371/22.3 |
| 4,698,588 | 10/1987 | Hwang et al. | 371/22.3 |
| 4,788,683 | 11/1988 | Hester et al. | 371/20 |
| 4,794,599 | 12/1988 | Purcell et al. | 371/20 |
| 4,947,357 | 8/1990 | Stewart et al | 371/22.3 |
| 4,947,395 | 8/1990 | Bullinger et al. | 371/22.3 |
| 4,980,889 | 12/1990 | DeGuise et al. | 371/22.3 |
| 5,001,713 | 3/1991 | Whetsel | 371/22.3 |

OTHER PUBLICATIONS

Reilly, John et al., "Processor Controller For IBM 3081," IBM J. Res. Develop., vol. 26, No. 1, Jan. 1982.
Monachino, Michael, "Design Verification System For Large Scale LSI Designs," IBM J. Res. Develop., vol. 26, No. 1, Jan. 1982.

Primary Examiner—Robert W. Beausoliel
Assistant Examiner—Ly V. Hua
Attorney, Agent, or Firm—Wolf, Greenfield & Sacks

[57] ABSTRACT

A method of diagnosing memory and CPU boards by using scan rings which are composed of interconnected shift registers. A maintenance processor (MP) downloads vector files to the scan rings. The scan rings are transparently partitioned into subsections and each subsection and individual bits are then tagged using a high level language, i.e., a scan path diagnostic language (SPDL). The user of SPDL writes a program in SPDL language addressing a portion of the scan ring. Next, the high level commands are translated into low level machine code and run on the MP. Bits are then loaded into the scan ring and subjected to a test routine. Additional commands are given to correct any errors uncovered and the bits are then reloaded through the MP to the hardware element being tested.

12 Claims, 4 Drawing Sheets

SCAN PATH DIAGNOSTIC METHOD

FIELD OF THE INVENTION

The present invention relates in general to a technique for allowing computer users to diagnose CPU and memory boards through high level commands, in order to maintain accurate data retention and performance of computers and I/O processors.

BACKGROUND OF THE INVENTION

Present day computer systems generally require intricate, low-level, time consuming operations to test hardware for proper operation. Computers employ registers which perform operations on strings of bits and these registers are used during testing procedures. Most computers group interconnected shift registers into scan rings, to aid in the testing. Generally, when a user needs to make a correction to a string of bits stored on a memory chip or the like, the entire string of bits needs to be analyzed, i.e., thousands of bits need to be dumped into a scan ring and individually analyzed.

It is desirable to have a system that employs a less cumbersome manner of identifying and correcting defective bits retrieved from hardware elements.

With most present day computer systems, in order for a user to check memory and CPU board operation, a low-level machine code program would have to be written. This entails listing every shift register and other hardware command individually and storing it in a file to subsequently be carried out by the computer. Not only does this require an exhaustive effort on the part of the user to write the code, but the computer system would be utilized for only this purpose during operation of this routine.

It is desirable to both have a powerful high level language which enables users to create hardware testing procedures simply, as well as one that operates from a command line, performing commands individually as typed next to a prompt. This would both save time and aggravation on the part of the user.

With most present day hardware testing procedures, strings of bits are loaded into scan ring registers and viewed serially. To return to a bit just previously viewed, the scan ring would have to be rotated a complete 360 degrees. This delay could become problematic if the step had to be repeated numerous times, which is not unlikely.

It is further desirable to reduce the amount of time used to scan bits in a scan ring.

SUMMARY OF THE INVENTION

Accordingly, it is an object of the present invention to allow users to test CPU and memory boards without having to view every bit in a scan ring in order to make a single correction.

It is a further object of the present invention to allow users to be able to view small portions of scan rings if they are only interested in checking certain items.

It is a further object of the present invention to allow users to test the state of CPU and memory boards through use of a high level language without having to write out machine level code.

It is a further object of the present invention to create a new mode of computer operation, easily accessible, which could carry out a hardware testing routine and return to normal operation upon command.

It is a further object of the present invention to be able to scan bits from a scan ring in a parallel fashion.

According to the present invention, these and other objects and advantages are achieved in a method for allowing the user to create testing subroutines with a high level powerful computer language. The present invention includes a high level assembly language allowing users to manipulate desired portions of scan rings, referred to as scan paths, in a time saving manner.

In brief, in accordance with the present invention there is provided a method for testing memory and other CPU hardware elements in response to high-level commands generated by a user. The method broadly comprises the steps of translating the user generated high level commands into low-level machine code, accessing the appropriate hardware element, loading bits into and retrieving bits from the scan ring in size, content, and location as requested by a user, and performing additional operations in accordance with the user generated high-level commands.

One feature of the present invention is a Scan Path Diagnostic Language (SPDL), which allows a user to work on a complete scan ring or on a specific portion of the scan ring, denoted as the scan path, depending upon the nature of the diagnostic. This invention accomplishes the objective of viewing portions of scan rings by transparently partitioning the scan rings into subsections. Each subsection, including a group of bits or an individual bit can then be tagged for future identification through use of certain commands available in the SPDL.

Another feature of the present invention allows a user to run a diagnostic test either from a command file or from the command line of the processor being used. Because the language can be run from the command line of a maintenance processor, the user can work in an interactive environment which allows direct communication between the keyboard and the scan ring.

According to another feature of the present invention, it is possible to test non-adjacent elements on a scan path in parallel. Due to this, scan path delay timing is reduced significantly.

According to another feature of the present invention, all testing operations are performed in an exclusive mode of operation called the SCAN mode. This mode of operation is accessible through use of a simple command. When the SCAN mode is entered the CPU is frozen and only SPDL operations may follow. Thus, a user may be working in an area outside of the scan mode and interrupt this work to test hardware by entering the SCAN mode. Subsequently, the user may return to continue the previous work by exiting the SCAN mode.

According to another feature of the present invention there is provided a method which comprises the step of appropriately responding to user generated debugging commands to allow a user to remedy faulty programs.

According to another feature of the present invention all debugging commands are exclusively carried out in a debugging mode of operation.

BRIEF DESCRIPTION OF THE DRAWINGS

Numerous other objects, features and advantages of the invention should now become apparent upon a reading of the following detailed description, taken in conjunction with the accompanying drawings, in which.

DETAILED DESCRIPTION OF THE INVENTION

Figure 1:
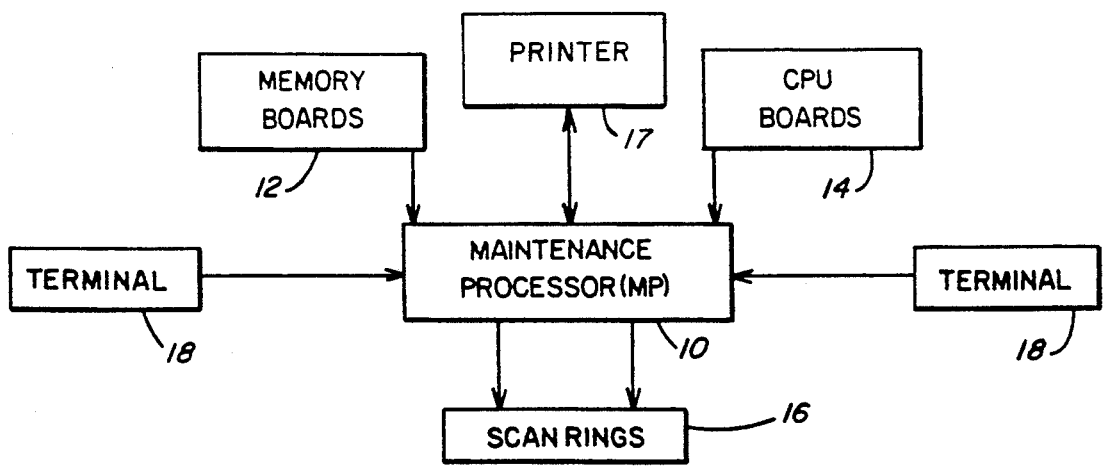
FIG. 1 is a general block diagram illustrating the broad concepts of the invention.
Figure 1A:
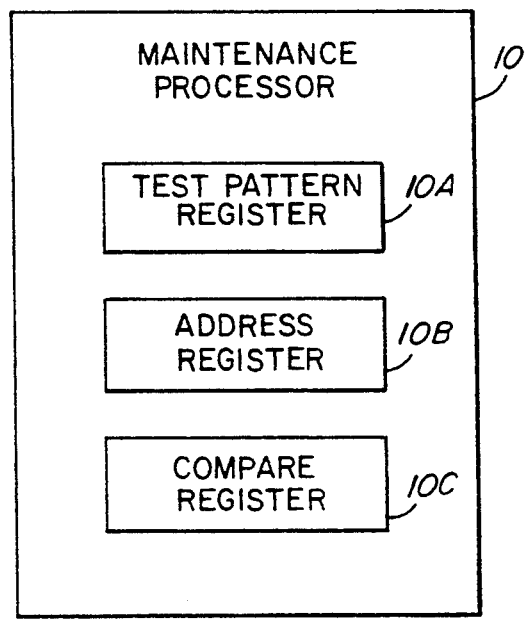
FIG. 1A shows a portion of the block diagram of FIG. 1 in greater detail.
Figure 1B:
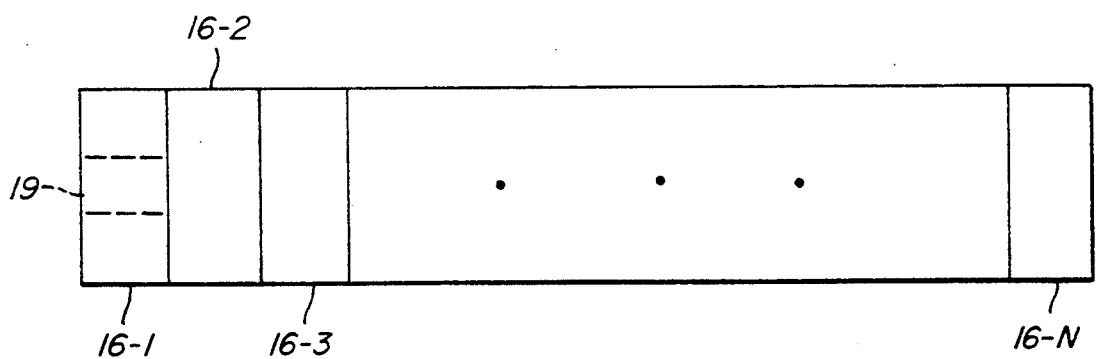
FIG. 1B shows another portion of the block diagram of FIG. 1 in greater detail.

A computer system incorporating the present invention is shown in block diagram form in FIG. 1. The system includes a Maintenance Processor (MP) 10 which receives testing commands and interacts with the appropriate hardware during execution. As shown in FIG. 1A, Maintenance Processor 10 includes a test pattern register 10A, an address register 10B, and a compare register 10C. During testing, data is transferred from memory boards 12 or CPU boards 14 to scan rings 16 and is subsequently viewed. As shown in FIG. 1B, scan rings 16 include a plurality of scan rings, including scan ring 16-1, scan ring 16-2, scan ring 16-3, ... scan-ring 16-N. A scan path 19 can, if and as desired, be defined on a portion of a scan ring, such as (but not necessarily) scan ring 16-1. A printer 17 and a plurality of terminals 18 may communicate with and utilize the MP. Prime 50-series architecture, produced by Prime Computer, Inc., is preferred, but not required, nor is the present invention limited thereto.

The present invention includes a high level assembly language (referred to hereafter as Scan Path Diagnostic Language or SPDL) which is designed to enable a user to quickly and easily diagnose memory and CPU boards. As indicated previously, in the past, in order to diagnose memory and CPU boards, strings of data from these hardware elements would have to be loaded into scan rings and individually viewed for correctness. The SPDL provides a means by which defective bits within a scan ring can be tagged, easily identified and viewed individually.

The SPDL provides a means for diagnosing the CPU through the scan path with a relatively high level of coding. The language is interpreted through a new MP mode, SCAN mode, and the code can either be entered directly on the command line through a terminal, or invoked with a filename of a file containing the code.

SPDL allows a user to concentrate on a specific portion of the scan ring. SPDL accomplishes this by requiring data to be entered into the scan path from the scan ring before viewing. The details of the scan path are transparent to the MP. Therefore, the string of bits within the scan path has no significant meaning or relationship to the software. Because of this the coder can work on the complete scan ring or on a specific portion of the scan ring, by only entering that portion into the scan path, depending on the nature of the diagnostic.

A useful tool is thus provided to the user who might only want to concentrate on a single bit or bit string in the scan ring. It also provides a quick and simple method to test small areas. Thus individual VLSI chips can be tested separately. It is common to have different designers for different VLSI chips who are only familiar with their own design. Employing the present invention, each designer can concentrate on his/her own portion of the scan ring for his/her own debug.

Figure 2:
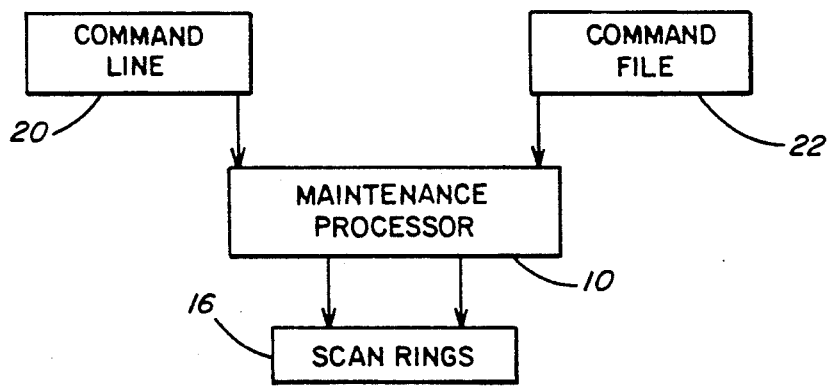
FIG. 2 is a diagram illustrating the SCAN mode of operation which accepts input from both the command line and command files.

As indicated in FIG. 2, the MP 10 accepts input from both the command line 20 and command files 22. The code can either be entered on the command line 20, through a terminal, or invoked with a filename of a file 22 containing the code. Basic testing can thus be done on the MP system console without the need of a file. If a short test, including only a few commands, needs to be performed, a user can do so directly from the command line 20 by typing in commands after a prompt on the terminal while in the SCAN mode.

Figure 3:
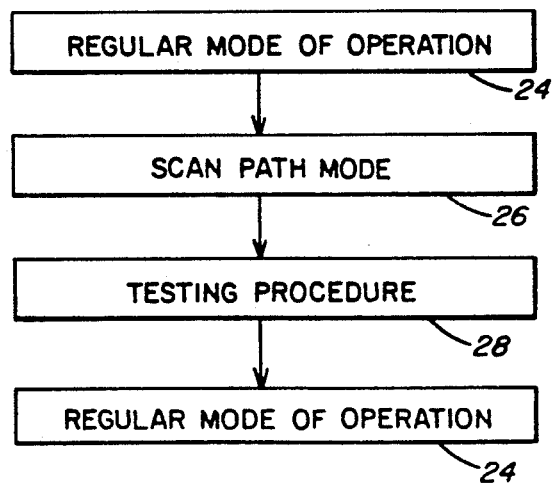
FIG. 3 is a flow chart of entering and exiting the SCAN mode of operation.

By use of the SPDL another mode of operation is added to current M/P modes of operation. This new mode is designated SCAN mode. FIG. 3 is a flow diagram illustrating the routine for entering and exiting the SCAN mode of operation. As shown, a user may invoke the SCAN path mode 26 to invoke a hardware test procedure 28 while in the middle of other MP work such as a regular mode of operation 24. The scan mode may be simply accessed at the MP by entering MO SCAN on the system console. Once in SCAN mode, the machine processor expects to receive a diagnostic test through either a file or a direct command. The user can invoke a diagnostic test by entering the filename of a previously created file which includes an SPDL test procedure. This file may be stored on one of the MP storage media and the MP would retrieve this file upon execution.

Alternatively the user can enter the commands directly from the command line 20. Once in SCAN mode, the user may invoke commands allowed in an SPDL file. This allows the user to create short tests in the SCAN mode while working previously in another mode of operation. Upon completion of the hardware test the user may return to the regular MP mode and continue work.

SPDL allows for the diagnosing of a CPU through the scan path with a relatively high level of coding. Data may be entered as binary, octal, hexadecimal, or decimal.

In the SPDL, comments are allowed at the end of a command line or on a line by itself. Putting a comment after a command requires no delimeters in the comment field. The parser will ignore any test after the semicolon. Putting a comment on a line by itself requires the comment be processed by a semicolon.

When manipulating data in registers the first argument in a command is usually the destination register. The results of the operation are usually placed in the register corresponding to the first argument and the original contents of that register are altered.

Each SPDL command file program must begin with a BEGIN statement and end with an ENDS statement.

Outlined below is a partial list of available commands to a user working with SPDL.

I. ARITHMETIC

A. ADDR

ADDR is used to add a number to a specified register or to add two registers. The sum is always placed in the first argument, which must be a register.

B. SUBR

SUBR is used to subtract a number from a specified register, or to subtract one register from another register. The result if placed in the second register.

C. INC

INC is used to increment a specified register by 1.

D. DECR

DECR is used to decrement a specified register by 1.

II. BINARY LOGIC

A. AND

AND is used to perform a bitwise AND operation on two 80 bit registers or on a register and a number. The two are ANDed together and the result is placed in the first register.

B. OR

OR is very similar to AND except that it performs a bitwise OR operation on the specified registers. The contents of the first register are ORed with the contents of the second and the result is placed in the second register. An immediate value can also be ORed with a register to obtain a result.

C. XOR

XOR performs a logical XOR on the specified registers and places the result in the second register XOR can also be used with an immediate operand.

III. DOWN LOADING FILES

A. DLOAD

DLOAD downloads a test procedure file from an outside operating system it was created on, such as PRIMOS, through the MP to the scan ring The file will be a string of hex digits which will be put into the scan ring. The file will end with a "$". The load will be terminated when either a "$" is encountered or the appropriate number of bits have been put into the scan ring. The bits in the file will only be loaded. The bits will not be interpreted.

B. LOADF

LOADF loads a file from one of the MP storage media to the scan ring. It is very similar to DLOAD except that the file is an MP storage media instead of an outside operating system like PRIMOS The file attributes are the same as that for DLOAD.

IV. UP LOADING FILES

A. ULOAD

ULOAD is used to upload a file from the scan ring to PRIMOS. The file produced takes on the same format as discussed under the LOADF command.

B. STOREF

STOREF is used to store a complete scan ring to a specified MP file. The file will be the hex equivalent of the scan ring terminated by a "$". This is the same format as for the LOADF and DLOAD commands.

V. LOOPING

A. CONTINUE/COUNTL

COUNTL sets up the counter register for looping within a command file. Every COUNTL command must be followed by a CONTINUE command. COUNTL marks the beginning of the loop and is followed by a number specifying how many loops, and CONTINUE marks the end of the loop.

VI. COMPARING

A. CMPS

CMPS is used to compare the values of two specified registers. If the values are equivalent, the next statement is skipped. If the values differ, the next statement is executed. The next statement will typically be an ECHO command to print out an error message.

VII. PRINTING

A. ECHO

ECHO is used to print text messages to the screen. This can be used to make the command file output more readable. The text must be delimited by double quotes ("), similar to print in standard "C" language.

B. PRINT

PRINT is used to print a register value to the screen.

VIII. SCAN RING REGISTER COMMUNICATION

A. PUTR

PUTR is used to put the value of a register into the scan path starting at the current position. For many applications there might not be a need for all 80 bits of a register, so the number field is used to specify how many of the bits are to be scanned in. This is done so the user can get at smaller fields and not have to duplicate the existing scan path in the unused portion of the scan ring.

B. GET

GET is very similar to PUTR except that it gets the value of the scan ring and puts it into the specified register. The number field on the command specifies the number of bits to access from the scan ring to be stored in the specified register.

IX. READ/WRITE

A. READST

READST is used to perform the read strobe to parts of the scan ring that need a separate read signal.

B. WRITEST

WRITEST is used to perform the write strobe to parts of the scan ring that need a separate write signal.

X. REGISTER MOVEMENT

A. MOVR

MOVR moves the contents from the source register to the destination register. The original contents of the destination register are destroyed.

XI. SHIFTING

A. SHFTL

SHFTL performs a logical shift left on a specified register. The contents of the register are shifted left a specified number of positions and zeros are shifted into the least significant bits of the register.

B. SHFTR

SHFTR performs a logical shift right operation on a specified register. The contents of the register are shifted right a specified number of bits and zeros are inserted in the most significant bits of the register.

XII. SCAN PATH POSITION

A. POSCAN

POSCAN is used to position the scan path so the 16-bit piece of the scan ring needed is aligned within the scan register. This allows the scan register to be read from and written to. An internal pointer is used to keep track of where the scan path is currently aligned so all POSCANs are relative from point O. If a POSCAN 128 is done, then for a POSCAN 129, the scan path will only be shifted 1 bit.

B. REALIGN

REALIGN re-aligns the scan path back to position O. This has the same effect as doing a POSCAN O.

XIII. CHANGE SCAN PATH

A. CCSP

CCSP is used to re-direct the scan commands to a specific scan path. The current scan path may be changed at any point in a command file. CCSP will change the current board, the current CPU, or both. The following boards are available: E board, PS board, OI board, IOPO board, IOP1 board, and BCU/ACU/SCU scan path. The following CPUs are available: CPU0, CPU1, CPU2, CPU3.

XIV. INITIALIZE REGISTER

A. SET

SET allows the user to fill one of the available registers with a specified value. Each register is 80 bits wide. When SETting a register with less than 80 bits, the upper bits of the register will be filled with 0.

XV. CLOCK ALIGNMENT

A. SHDCLK

SHDCLK strobes the shadow register clock on the scan path. This allows the data in the shadow register to be clocked to its appropriate data register.

XVI. DEBUG

A. STEPP

STEPP allows the user to step the processor through a specified number of commands.

Figure 4:
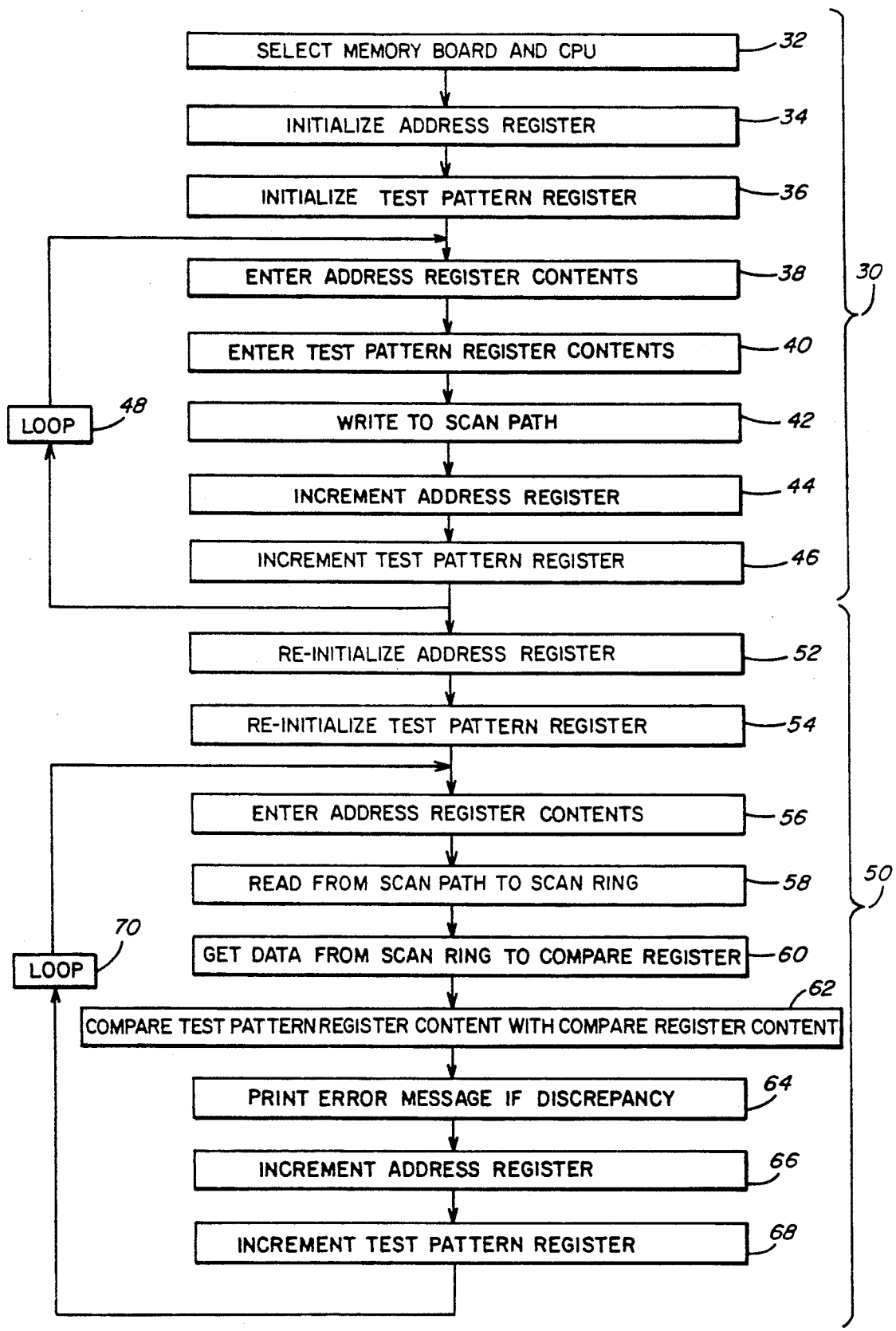
FIG. 4 is a flow chart of a sample diagnostic test program.
Figure 5:
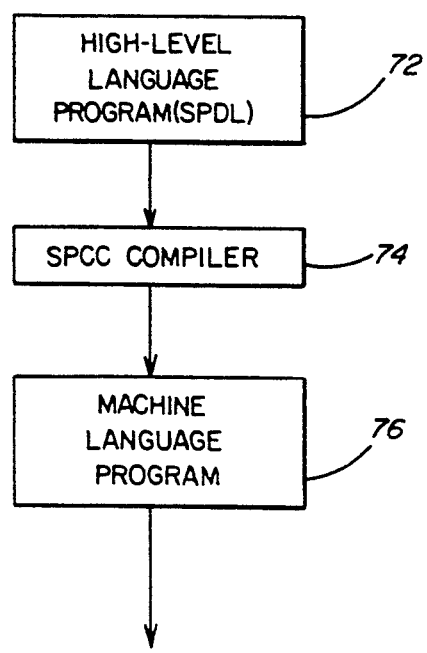
FIG. 5 is a flow chart of the SPCC compiler operation.

FIG. 4 illustrates a flow diagram of a SPDL program for testing a memory element in a CPU. The memory element could be a RAM module with an array of bits, which is chosen as the scan path location. The program includes writing a test pattern to all locations on the scan path, and subsequently reading from these locations and comparing the data to the test pattern that was written, If a discrepancy is revealed in the comparison, the program will print out an error message.

As can be seen in FIG. 4, the program includes two subroutines 30,50. Subroutine 30 entails writing a test pattern to all locations on the scan path. Subroutine 50 entails reading from all of said locations on the scan path and comparing to the test pattern.

As displayed in FIG. 4, the first step 32 in subroutine 30 is to select a scan path, which includes a memory board or element and corresponding CPU, to test. The second step 34 requires initializing the address register with the initial scan path address to be accessed. The third step 36 comprises initializing the test pattern register to an initial value. The fourth 38 and fifth 40 steps, respectively, are entering the address register contents and entering the test pattern register contents into the scan ring. The sixth step 42 consists of writing the test pattern to the scan path at the appropriate address location. The seventh 44 and eighth 46 steps consist of, respectively, incrementing the address register contents and the test pattern register contents. These eight steps are then repeated through the use of a loop until every memory bit in the scan path has been written to. For example, if the memory element being tested is a 4K×72 bit RAM module, then the test pattern register would be 72 bits long and steps 38-46 would be repeated 4K times. The loop command 48 is shown as the ninth step in subroutine 30.

Subroutine 50, which includes reading from the scan path and comparing to the test pattern, begins when all memory element locations on the scan path have been written to. As shown, the tenth 52 and eleventh 54 steps which begin subroutine 50, consist of, respectively, re initializing the address register and the test pattern register to the same values initialized during steps 2 and 3 in subroutine 30. The twelfth step 56 requires entering the address register contents to the scan ring. The address denotes the appropriate location on the scan path to be read from, which is the location written to in subroutine 30. The thirteenth step 58 calls for reading from the scan path to the scan ring. The fourteenth step 60 consists of getting the data from the scan ring into the compare register. The fifteenth step 62 requires comparing the contents of the test pattern register to the contents of the compare register. The sixteenth step 64 will be executed only if a discrepancy is revealed during the comparison conducted by the fifteenth step. In the event of a discrepancy, an error message will be printed. The seventeenth 66 and eighteenth 68 steps respectively will accomplish incrementing the contents of the address register and test pattern register. Steps 56-68 are repeated as many times as steps 38-46 were repeated during subroutine 30. The loop 70 occurs so that every location that was written to during subroutine 30 will be read from and compared during subroutine 50.

Because SPDL is a high level powerful language, a user can implement this program easily with the user-friendly commands described above. The flow diagram of the program, shown in FIG. 4, can be used to test most memory and other hardware storage elements. Specific scan paths, initial addresses, and test patterns will have to be chosen in accordance with the hardware element being tested. Any size hardware element can be tested as the scan path can be shortened or lengthened as needed, and the loop can be increased or decreased accordingly.

The following is an example of an SPDL program for testing a RAM module that is on the scan ring. The routine tests a 4K×72 bit RAM module located on the scan path from bits 128-200. The modules require that a read and a write strobe be used to access/modify data:

```
BEGIN
   ECHO "Start RAM Module Diagnostic"
   CCSP 0,0              ; select PS board and CPU0
   SET r0,0              ; initialize the r0 register
   SET r1,0              ; initialize the r1 register
   COUNTL #4096          ; set the loop count to be 4K
   POSCAN #302           ; align to address field
   PUTR r1, #12          ; enter address
   POSCAN #128           ; point to beginning of RAM module
   PUTR r0, #72          ; put r0 into scan ring
   REALIGN               ; re-position the scan ring
   WRITEST               ; perform the write strobe
   INC r1                ; increment the address field
   INC r0                ; increment the test pattern
   CONTINUE              ; go to the top of the loop
   SET r0,0              ; re-initialize the r0 register
   SET r1,0              ; re-initialize the address field
   COUNT #4096           ; reset the count
   POSCAN #302           ; align with address field
   PUTR r1, #12          ; enter address
   REALIGN               ; re-position scan ring
   POSCAN #128           ; align with RAM module
   GET r2, #72           ; get all 72 bits of data
   CMPS r0, r2           ; compare w/ expected results
   ECHO "Data
   Miscompare Error"     ; print error message
   INC r0                ; increment test pattern
   INC r1                ; increment the address
   CONTINUE              ; loop till done
   ECHO "End of
   RMD"
```

-continued

ENDS;

In order to speed the execution time of a SPDL command file, the invention includes a compiler which is called the SPCC compiler. The SPCC compiler translates the high level language commands into low level machine language commands, which the computer can understand. This eliminates the need to parse each command as the file is run.

Fie. 5 illustrates the compiling procedure. As shown, a high level language program (SPDL) is entered and the SPCC compiler 74, when invoked, translates this into machine language code 76 which the computer can interpret.

The SPCC compiler is run under an outside operating system such as PRIMOS. The maintenance processor produces machine language code in binary form which can be run through SPDL. The compiler is stored in a directory within said outside operating system.

To invoke the compiler, the SPCC program compiler is run with the .spdl file as a command line input. The .spdl file is a test file created with the above-described SPDL commands. The compiler will produce an .exe and an .out file. The machine language code is put into the .exe file (the executable file for SPDL), and the output of the compile (including any error messages) is put in the .out file.

An example of how to run the SPCC compiler and the files that are outputted is as follows: Ict.spdl is a cache test program. It could be any .spdl test file. After a prompt from the operating system, the user should type in the command, "RUN SPCC ICT.SPDL". This accesses the SPCC compiler and tells it to compile the test file ict.spdl. The operating system will then return with the display SPCC REV. 1.0 showing the SPCC compiler REV. 1.0 has been accessed. Upon completion of the compiling, error messages, if any, will be listed. If compiling is accomplished without any errors, this will also be listed, as well as the number of lines compiled.

Ict.exe would be the executable file outputted from the compiler and ict.out would be the output file which contains the result of the compiling, and any errors there might be.

The error messages outputted from running SPDL command files and running the SPCC compiler are the same messages. They define all the errors A message tells the user what is incorrect with the command and what line number the error occurred on.

The following is a list of the error messages that will occur and the proper action that should be taken by the user thereafter in running the SPCC compiler.

NO INPUT FILE

This message tells the user that no input file was entered for the SPCC compiler. The user should run the compiler again with an input file.

UNABLE TO OPEN FILE

This tells the user that the computer was unable to open the spdl input file specified for the compiler. The user should make sure that the input file has the correct file name and exists in memory.

NO BEGIN STATEMENT FOUND

This message tells the user that no BEGIN statement was found at the beginning of the .spdl file. The user should make sure that the first executable line in the .spdl file is the BEGIN command.

INVALID COMMAND

This tells the user that an invalid command was entered in either the command file or the input line (while in scan mode). In this case the user should re type the command using correct syntax, if in Command mode.

INVALID REGISTER NAME

This tells the user that an invalid register mnemonic was entered in the command file or on the input line. The user should check the command for valid register names (r0-r9) and retry the operation.

INVALID IMMEDIATE OPERAND

This tells the user that an invalid number was inputted while using the immediate operand instructions. The user should check the current default radix and use radix prefix characters where necessary.

INVALID SCAN PATH NAME

This tells the user that an invalid scan path name was inputted while using the CCSP command. The user should check the list of valid scan path names in the SPDL spec and retry the operation.

INVALID CPU NAME

This tells the user that an invalid CPU name was entered while using the CCSP command. The user should check the list of valid CPU names in the SPDL spec and retry the operation.

WARNING: NUMBER TOO LARGE, TRUNCATED TO 16 BITS

This warns the user that a number was inputted that was larger than the 16 bit quantity the SPCC compiler is looking for. The number is truncated to take the least significant 16 bits. In this case, if the least significant 16 bits is ok with the user, then the user may ignore the warning. Otherwise, the user should re-enter an adequate number that is not greater than 16 bits long.

NO BEGINNING QUOTE IN ECHO COMMAND

This tells the user that no beginning quote was found in the ECHO command, which is one of the print commands. In this case, the user should add a beginning quote to the ECHO command.

UNDEFINED SCAN COMMAND

This tells the user that an undefined scan command was entered. The user should check the syntax of the command, correct the form and try again.

INVALID NUMBER

This tells the user that an invalid number was entered. Usually, the number is inputted incorrectly or is in the wrong radix. In this case the user should check the current default radix or use radix prefix characters where necessary.

The invention further provides a set of debug commands within SPDL. This allows users to do some rudimentary debugging on their SPDL programs. The debug commands can be used on either command language .spdl files or compiled .exe files. The debug commands are not available for use in the command line (non-file) mode of operation.

For example, the DEBUG mode is entered by adding "—DEBUG" to the SPDL command. When the DEBUG mode is entered, a ">>" is added to the end of the scan prompt. The prompt includes a label describing which CPU and memory board or element is being accessed with the present scan path, as well as the current position. Once in the DEBUG mode, the user can perform any valid SPDL command from the command line.

The following are examples of the DEBUG commands that are available within SPDL.

BRK

BRK is the command used to set a breakpoint. This command allows the user to define locations in his/her program where he/she wishes the program to suspend execution so that he/she may examine the data and registers to ensure that the code is executing as designed. These locations, where program execution is suspended, are called breakpoints. During execution, when the program reaches a breakpoint location, control is passed to the monitor, and the user has access to all the standard functions. Breakpoints can be set at an valid SPDL command file line number. Execution will be stopped after the command at which the breakpoint was set. After the breakpoint has been executed, it is cleared. To continue the same breakpoint again (e.g. while in a loop), the breakpoint must be set again. Only one breakpoint is allowed at one time. If the breakpoint command is done twice, before a CONT or RST command, the second of the two breakpoints will be the breakpoint address.

CLR

CLR allows the user to clear the current breakpoint. This will reset the current state so that there are no breakpoints in the code.

CONT

CONT allows the user to continue execution from the breakpoint forward into the program. This will continue the program execution from where it broke until another breakpoint is encountered or the program has finished execution.

PC

The PC command allows the user to set the current program counter to the specified line in the SPDL program. This will, in effect, let the user re-start the program from a different entry point. A subsequent CONT command will begin execution at the line number specified after the PC command.

RST

The RST command allows the user to re start the command file again. The execution will always begin from the beginning of the file.

SNGLSTEP

The SNGLSTEP command allows the user to step a specified number of SPDL commands in a command file.

Testing and running SPDL programs can be done on an outside operating system such as PRIMOS. The scan paths are simulated using memory arrays. Any command file (.spdl or .exe) can be executed and debugged on a machine which employs an outside operating system. This will considerably speed the execution and debugging of .spdl files and also alleviate the problem of finding an MP to test .spdl files on.

When considering timing for SPDL, two areas must be looked at. One is the time it takes for the CPU to perform the scan. The other is the time it takes for the SPDL instruction to be executed. Some instructions are dependent upon the speed of the CPU scanning operation (i.e., POSCAN). For this reason, all instruction timings are calculated separately from scan path delay It takes a considerable amount of time to rotate the scan path a complete cycle. To load a bit into the scan ring, the ring must be rotated a complete 360 degrees. During a read/write operation, the ring must be rotated first to read/write a bit., and then rotated back to re-align the ring. If the scan ring is 1000 bits, this operation could take 36 $\mu$secs for example, regardless of the time necessary for the MP to read/write the bit. If this operation was to take place 4K times (like in the RAM module test described above), the scan path delay time would be 4K $\times$ 36 $\mu$secs, or 0.15 secs. If a read/write test were being performed, this number becomes doubled to 0.3 secs. This time does not include MP overhead to load the data and compare results.

In order to reduce the amount of time spent scanning, the invention provides for testing certain elements on the scan path in parallel. This increases the MP overhead but reduces the scan path delay timing considerably. This method can be used when multiple RAM modules reside on one scan ring.

There are three basic types of instructions in the SPDL. These include register instructions, non-register instructions, and file specific instructions. The fastest instructions are the non register instructions, and the slowest instructions are the file specific instructions. The following discussion describes the general timing involved in each of the types of instructions and estimates the total timing involved in an example program.

Non-register instructions are all those instructions that require little or no involvement with the 80-bit registers. The non register instructions are as follows: COUNTL, DECR, INC, POSCAN, PRINT, READST, REALIGN, SHFTL, SHFTR, STEP, TOP, WRITEST, and ECHO.

A typical example of a non-register instruction is the REALIGN instruction. This instruction realigns the scan path back to its original position. The 80186 machine code necessary to perform this instruction is as follows:

```
push si
push di
push bp
mov bp, sp              ; save the important stuff
lds di,                 ; point to scan count register
 PDA_SCAN_COUNT
mov bx, SCANSIZE        ; put scan size into bx register
sub CURPOINT, bx        ; get scan number back to original
not bx                  ; complement number
inc bx                  ; make 2's comparison
mov ds:[di], bx         ; put it in the count register
lds di, PDA_CMDREG      ; point to cmd reister
mov ds:[di], SCAN_GO    ; kick off scan
lds di, PDA_STATUS      ; point to status register
test again: test ds:[di],  ; test for scan done
 SCAN_DONE
jz test again
mov sp, bp              ; clean-up after scandone
pop bp
pop di
pop si
```

-continued

```
ret
```

If these instructions alone, not including the scan path delay, take 30 μsecs to execute, it is possible that the scan path delay could take a maximum time of 36 μsecs. Therefore, in this example the worst case timing for a REALIGN instruction would be 66 μsecs. On the average, however, instructions of this type take about 20 μsecs to execute.

Register instructions are those which involve the 80-bit wide data word. These 80-bit registers are preferably blocks of memory in maintenance processor 10. The following are examples of register instructions: ADDR, AND, CMPS, OR, SET, SUBR, PUTR, GET, and XOR.

A typical register instruction is the ADD instruction. This instruction takes two 80-bit registers, adds their values, and places the result in a destination register. The 80186 machine code necessary to perform this instruction is as follows:

```
        push si
        push di
        push bp
        mov bp, sp              ; save all the good stuff
        clc ; clear the carry bit
        mov ds, [bp + 0ah]
        mov di, [bp + 0ch]      ; put first reg. addr. in ds:di
        mov es, [bp + 0eh]
        mov si, [bp + 10h]      ; put 2nd reg. addr. in es:si
        mov bx, 0               ; clear count register
top:    mov cx, ds: [di]        ; put 16 bits in cx
        adc cx, es:[si]         ; perform an add w/ carry
        inc di
        inc si                  ; inc. reg. pointers
        inc bx                  ; increment count
        cmp bx, 05h             ; test for done
        jl top
        mov sp, bp
        pop bp
        pop di
        pop si                  ; restore all the good stuff
        ret
```

If the execution of the machine code set forth above takes 56 μsecs and since there is not scan path delay associated with the instruction, the worst case timing would be 56 μsecs.

File-specific instructions include those instructions which require file-specific operations. Examples of such instructions include: DLOAD, LOADF, STOREF, ULOAD. LOAD and STOREF are local file instructions and interface with the MPOS and its disk storage facilities. ULOAD and DLOAD require communication with an outside operating system such as PRIMOS through the MP outside operating system load facility (i.e. MP-PRIMOS). Since this communication takes place over a serial line, these two instructions will be slower than the MP specific instructions.

As an example of the time saved by employing the test program of the invention the execution time for the SPDL sample program discussed previously for the 4K×72 bit RAM module test required 2.4 seconds to perform a full read/write test. This time does not include the time required to parse the instructions. It only includes the time necessary to perform each instruction. Since SPDL is an interpretive language, each instruction must be parsed each time through the loop.

While the present invention has been described by reference to a preferred embodiment thereof, numerous variations and modifications could be made thereto by those skilled in the art without departing from the spirit and scope of the invention.

What is claimed is:

1. A method for testing at least one hardware element for proper operation, wherein interconnected shift registers are grouped into scan rings, said method comprising the steps of:

creating at least one high-level command for a testing subroutine employing a high-level computer language;

translating said at least one high-level command into low-level machine code;

accessing a scan path to be tested corresponding to the at least one hardware element;

accessing one of said scan rings of said shift registers to be utilized during testing of the at least one hardware element;

loading bits from said scan path into said one scan ring;

performing said low-level machine code to accomplish at least one correcting operation on said loaded bits;

retrieving said corrected bits from said scan ring; and returning said retrieved bits to said scan path.

2. A method as set forth in claim 1, wherein the step of translating said at least one high-level command into low-level machine code is performed by a compiler.

3. A method as set forth in claim 2, further including the step of said compiler outputting error messages to a terminal to indicate to a user what is incorrect about specific commands.

4. A method as set forth in claim 1, wherein said low-level machine code includes 80186 type machine code.

5. A method as set forth in claim 1, further comprising the step of viewing bits which are dumped from said scan path into a scan ring for correctness.

6. A method as set forth in claim 5, further including the steps of:

prior to said accessing steps, dividing said scan ring into partitions for independent operation; and after said loading step, scanning only small portions of this scan ring for testing purposes.

7. A method as set forth in claim 1, further comprising the step of:

after said loading step, testing said scan path by scanning bits from the scan ring in a parallel fashion.

8. A method as set forth in claim 1, further including the step of aligning the position of said scan path, in relation to said scan ring.

9. A method as set forth in claim 1, wherein said at least one high-level command includes arithmetic and logical register operations, looping and printing.

10. A method of claim 1, wherein said at least one high-level command includes a debugging command.

11. The method of claim 10, wherein said debugging command allows a user to set breakpoints in a program file, change register values, and align the scan path.

12. The method of claim 10, wherein during said method the at least one hardware element undergoes a normal operation, and wherein the normal operation is interrupted during operation of the debugging command.

* * * * *